(12) United States Patent
Schaefer (10) Patent No.: US 8,228,064 B2
(45) Date of Patent: Jul. 24, 2012

(54) MAGNETIC FIELD GRADIENT GENERATING SYSTEM AND METHOD FOR REDUCING THE NOISE LEVEL IN NMR/MRI EXPERIMENTS

(75) Inventor: Ernest Schaefer, Rott (FR)

(73) Assignee: Bruker Biospin (Societe par Actions Simplifiee), Wissembourg (FR)

( * ) Notice: Subject to any disclaimer, the term of this patent is extended or adjusted under 35 U.S.C. 154(b) by 319 days.

(21) Appl. No.: 12/710,833

(22) Filed: Feb. 23, 2010

(65) Prior Publication Data
US 2010/0213940 A1 Aug. 26, 2010

(30) Foreign Application Priority Data
Feb. 25, 2009 (EP) ..................... 09305176

(51) Int. Cl.
*G01V 3/00* (2006.01)
*G01V 3/14* (2006.01)
(52) U.S. Cl. ......... 324/318; 324/309; 324/322; 382/128
(58) Field of Classification Search .......... 324/300–322; 382/128–133; 600/407–464
See application file for complete search history.

(56) References Cited

U.S. PATENT DOCUMENTS

| | | | |
|---|---|---|---|
| 5,349,296 A | 9/1994 | Cikotte et al. | |
| 5,442,291 A | 8/1995 | Tyburn et al. | |
| 7,102,349 B2 * | 9/2006 | Hornung | 324/312 |
| 7,847,552 B2 * | 12/2010 | Haworth et al. | 324/318 |
| 2006/0033496 A1 * | 2/2006 | Shvartsman et al. | 324/318 |

OTHER PUBLICATIONS

Parella T.: "Pulsed field gradients: a new tool for routine NMR", Magnetic Resonance in Chemistry, Dec. 18, 1998, pp. 467-495, vol. 36, XP002607211.
Price W.S.: "Pulsed-Field Gradient Nuclear Magnetic Resonance as a Tool for Studying Translational Diffusion: Part II. Experimental Aspects", Concepts in Magnetic Resonance, Dec. 7, 1998, pp. 197-200, vol. 10, No. 4, XP002607212.
European Search Report, dated Oct. 28, 2010, in EP 09 30 5176.

* cited by examiner

*Primary Examiner* — Melissa Koval
*Assistant Examiner* — Emily Chan
(74) *Attorney, Agent, or Firm* — Young & Thompson (57) ABSTRACT

A magnetic field gradient generating system for a NMR system, includes at least one set of gradient coils, preferably arranged according to three axes of a spatial referential system, and a controlled power supplying unit for the gradient coils, the power supplying unit including, for each gradient coil, a converter/amplifier module, the modules being fed with pulse sequences of digital gradient data provided as word streams by an adapted gradient data generator according to a pulse program, each arrangement of a gradient coil and a converter/amplifier module forming a gradient channel. The power supplying unit also includes an automatic blanking system which scans the gradient data words sent to the [converter/amplifier] modules and, according to sensed values, selectively delivers blanking signals to be applied to the modules in order to disable the power stages of their respective amplifiers connected to the gradient coils, when no current is to be fed to the coils.

17 Claims, 4 Drawing Sheets

MAGNETIC FIELD GRADIENT GENERATING SYSTEM AND METHOD FOR REDUCING THE NOISE LEVEL IN NMR/MRI EXPERIMENTS

FIELD OF THE INVENTION

The present invention is related to the field of MRI and NMR systems, equipments and working methods, and concerns in particular improvements allowing to increase the quality of acquisition by reducing the noise level.

The present invention concerns more specifically a magnetic field gradient generating system, a NMR or MRI system comprising at least one such gradient generating system and a method for reducing the noise level in NMR/MRI experiments, in particular during acquisition phases in NMR/MRI systems.

BACKGROUND OF THE INVENTION

Typically a gradient system is made of three axes, X, Y and Z, this means that the system can supply three different gradient pulses on three different coils at the same time. A gradient supply for a given axis is also called a gradient channel.

It is known that the remaining noise level of the power sources feeding the gradient coils results in artefacts or other detrimental signals and thus leads to erroneous measurements or distorted images, in particular when high resolution experiments are involved.

A first type of solution is based on external hardware switching means, which when activated cut the gradient coils from their power source(s), in particular from the output stage of the feeding power amplifiers. One example of such a hardware switch is disclosed in EP 0 598 670.

A second type of solution has been proposed in relation to digitally controlled power feeding means, wherein a pulse program defines the pulse sequences which are specific to each NMR experiment.

A digital gradient pulse generator translates the programmed pulses into system wide synchronous digital gradient data pulses, in the form of word streams. A data dispatcher then extracts from the consecutive words the data for each channel and sends them to the channel's bipolar digital-to-analog voltage converter.

Finally, the gradient amplifier, which can be considered as a transconductance amplifier and constitutes a module with its associated converter, supplies the current to the specific axis coil. The reference current in the gradient coil (0 A) is generally given for an amplifier input of 0V (i.e. the digital mid-scale).

When implementing such digitally controlled power feeding means, a blanking signal code can be embedded into the adequate words of the word stream corresponding to the translated programmed pulses, said blanking signal allowing to disable the output of the concerned amplifier.

The gradient data words which are delivered by the digital gradient data generator generally comprise at least the following four fields:
- a data field containing the gradient data to be converted by the digital-to-analog converter. As seen before, the data representation is normally bipolar and the mid-scale (zero) value is the reference value,
- a channel address field containing the address of the gradient channel for which the data are intended,
- a strobe flag (which is used to signalize that the data and address fields are valid),
- a next gradient order flag Furthermore, these gradient data words can be of three different types, namely:
- Effective data words: for these words, the data, address and the strobe flag are valid, the next gradient order flag is disabled. When this word is received, the data is latched for the specified gradient channel.
- Next Gradient Order words: for these words, the next gradient order flag is raised and the data, address and the strobe fields are discarded. When this word is received the last latched data for each gradient channel is send to the converter.
- Stuffing words: for these words, the strobe and next gradient order flags are not raised. Such kind of words have no effect on the gradient output and have to be discarded.

It should be noticed that the words are transmitted synchronously and that therefore a constant reference clock signal is transmitted with the data lines. Generally the pulse generator sends much more stuffing words than the two other word types. This implies that the word rate itself can be much higher than the actual gradient data rate.

When applying the second type of solution, the blanking signal has to be enabled when the amplifier's input, for a given channel, is set to 0 volt (or to a value resulting in no current being fed to the connected gradient coil).

Figure 1:
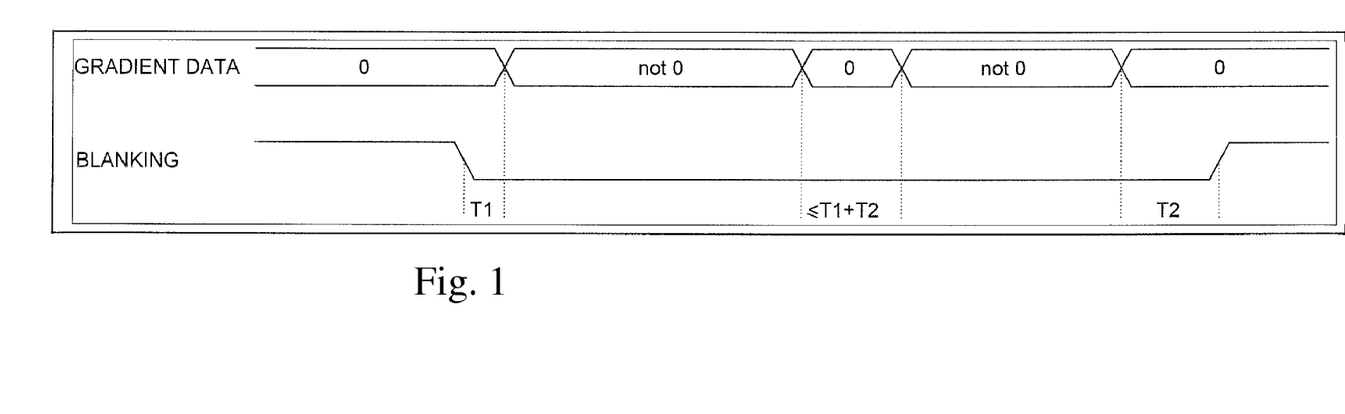
FIG. 1 depicts the gradient data/blanking signal timing chart.

Nevertheless, some hardware linked constraints must be observed when switching the blanking signal (see FIG. 1 showing [the gradient data/blanking signal] timing chart):
- Because of the amplifier output stage activation delay, when the gradient data go from a null value to a non null value (i.e. the gradient supply is to be enabled), the blanking signal must be disabled with a given delay ($T_1$ on FIG. 1) before the gradient data becomes non null.
- Because of the time constants introduced by the amplifier frequency response and the load (the gradient coil), when the gradient data switch from a non null to a null value (i.e. the gradient supply is to be disabled), the blanking signal must be enabled with a given delay ($T_2$ on FIG. 1) after the data were driven to zero.

As a consequence of the two preceding points, the blanking signal must not be activated in case of a "data is null" sequence which does not last longer than the sum of $T_1$ and $T_2$. $T_1$ and $T_2$ have generally the same values for all gradient channels, but are dependent on the hardware of the gradient channels.

SUMMARY OF THE INVENTION

The present invention contemplates primarily an improved magnetic field gradient generating system and a corresponding method which allows to reduce efficiently and reliably the noise level in NMR/MRI experiments, in particular during acquisition phases in a NMR system, while being free of any additional hardware switching means and any tedious specific programming for each different experiment and/or gradient generating system.

According to one aspect of the invention, there is disclosed a magnetic field gradient generating system for a NMR system, comprising at least one set of gradient coils, preferably arranged according to the three axes X, Y, Z of a spatial referential system, and controlled power supplying means for said gradient coils, said power supplying means comprising, for each gradient coil, a converter/amplifier module, said modules being fed with pulse sequences of digital gradient data provided as word streams by an adapted gradient data generator according to a pulse program, each arrangement of a gradient coil and a converter/amplifier module forming a gradient channel, gradient generating system characterised in that said controlled power supplying means also comprise an automatic blanking system which scans the gradient data words sent to the [converter/amplifier] modules and, according to the sensed values, selectively outputs or delivers blanking signals to be applied to said modules in order to disable the power stages of their respective amplifiers connected to the gradient coils, when no current is to be fed to said coils.

According to an other aspect of the invention, there is also disclosed a method for reducing the noise level in NMR/MRI experiments, in particular during acquisition phases in a NMR or MRI system comprising at least one magnetic field gradient generating system which is mainly composed of at least one set of gradient coils, preferably arranged according to the three axes X, Y, Z of a spatial referential system, and of controlled power supplying means for said gradient coils, said power supplying means comprising, for each gradient coil, a converter/amplifier module, said modules being fed with pulse sequences of digital gradient data provided as word streams by an adapted generator according to a pulse program, each arrangement of a gradient coil and a converter/amplifier module forming a gradient channel, method characterised in that it mainly consists in using an automatic blanking system forming part of the controlled power supplying means, in order to scan the digital gradient data sent to the [converter/amplifier] modules and, according to the sensed values, to output selectively blanking signals which are applied to said modules for disabling the power stages of their respective amplifiers connected to the respectively associated gradient coils, when no current is to be fed to said coils.

BRIEF DESCRIPTION OF THE DRAWINGS

The present invention will be better understood thanks to the following description and drawings of an embodiment of said invention given as non limitative example thereof, wherein.

DETAILED DESCRIPTION OF THE DRAWINGS

Figure 2:
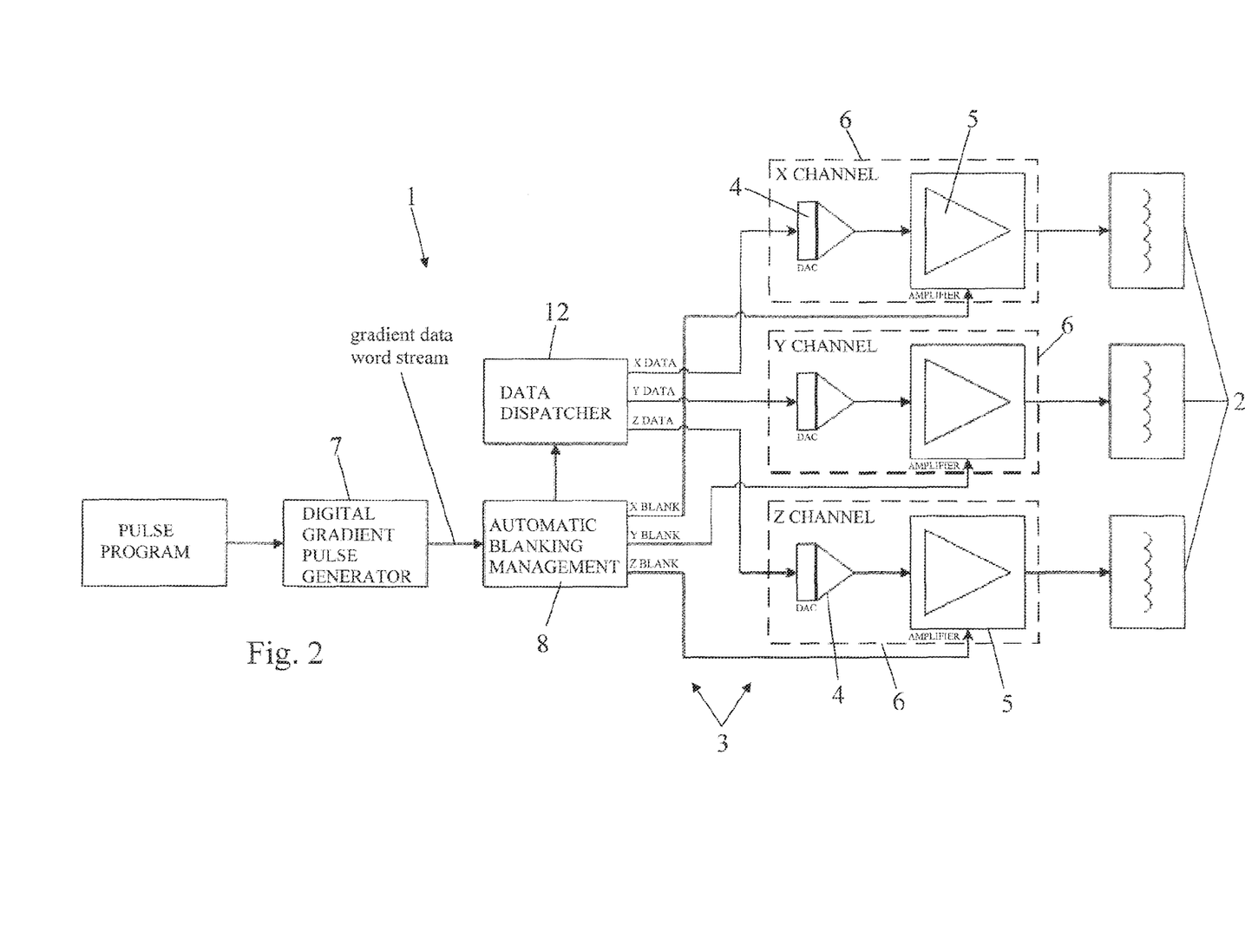
FIG. 2 is a block diagram of an embodiment of the magnetic field gradient generating system according to the invention, in case of a three axis gradient generating system.

FIG. 2 shows a magnetic field gradient generating system 1 for a NMR system, comprising at least one set of gradient coils 2, preferably arranged according to the three axes X, Y, Z of a spatial referential system, and controlled power supplying means 3 for said gradient coils 2.

Said power supplying means 3 comprise, for each gradient coil 2, a [converter 4/amplifier 5] module 6, said modules 6 being fed with pulse sequences of digital gradient data provided as word streams by an adapted gradient data generator 7 according to a pulse program, each arrangement of a gradient coil 2 and of an associated [converter/amplifier] module 6 forming a gradient channel.

According to the invention, the power supplying means 3 of said gradient generating system 1 also comprise an automatic blanking system 8 which scans the gradient data words sent to the [converter 4/amplifier 5] modules 6 and, according to the sensed values, selectively generates blanking signals to be applied to said modules 6 in order to disable the power stages of their respective amplifiers 5 connected to the gradient coils 2, when no current is to be fed to said coils 2.

Thus, by applying the inventive dispositions, no additional hardware switching means are requested, and no specific programming is needed, while achieving reliable and efficient noise reduction when gradient signals are not to be applied to the coils 2.

Although the invention is described herein more particularly in relation to a three dimensional gradient generating system, it is easily understood that it can also be implemented in relation to other types of gradient generating systems.

Advantageously, the automatic blanking system 8 is mainly comprised of means 9 for delaying the transmission of the successive gradient data words to the [converter/amplifier] modules 6, means 10 for sensing and evaluating the values of the delayed data words and means 11 for selectively delivering, in a time controlled manner and/or with a delay, a blanking signal to be applied to the amplifier 5 of the [converter/amplifier] module 6 of the corresponding gradient channel, according to the evaluation results of the successively sensed values.

As shown in FIG. 2, the automatic blanking system 8 is incorporated within the power supply means 3 of the gradient coils 2. It does not alter the gradient data, but only senses and delays them.

A conditional blanking generator 9' is provided when considering means 10 and 11 together, as a functional assembly.

Various embodiments and implementation configurations are possible for the automatic blanking system 8 according to the invention.

According to a first alternative, the blanking system 8 can have a multiple constitution, incorporating one particular set of each of the means 9, 10 and 11 (forming as many elementary blanking systems) for each of the different gradient channels. Thus, each elementary blanking system associated with a given gradient channel senses only the gradient data words intended for that channel and issues a blanking signal specifically for the amplifier of said channel.

According to a second and preferred alternative, the automatic blanking system 8 is contemplated as having a single delaying means 9 for the single word stream incorporating gradient data for all gradient channels and a specific set of means 10 and 11 for each of the gradient channels, able to issue a particular conditional blanking signal for the amplifier of its associated gradient channel.

Thus, in relation to this second alternative embodiment, the gradient generating system 1 according to the invention is further characterised in that the single stream of digital gradient data words, which is provided by the gradient data generator 7 according to a single pulse program and sensed by the automatic blanking system 8, incorporates gradient control data for each gradient coil 2 and in that a data dispatcher module 12 is provided which extracts the data words for each gradient coil 2 and delivers them to the corresponding associated [converter/amplifier] module 6, the automatic blanking system 8 generating selectively a specific blanking signal to the amplifier 5 of each module 6, according to the sensed values of the successive data words intended for the considered gradient coil 2.

It can also be noticed that the automatic blanking system 8 can be at least partially hardware, as well as the generator 7 and/or the data dispatcher 12.

Figure 3:
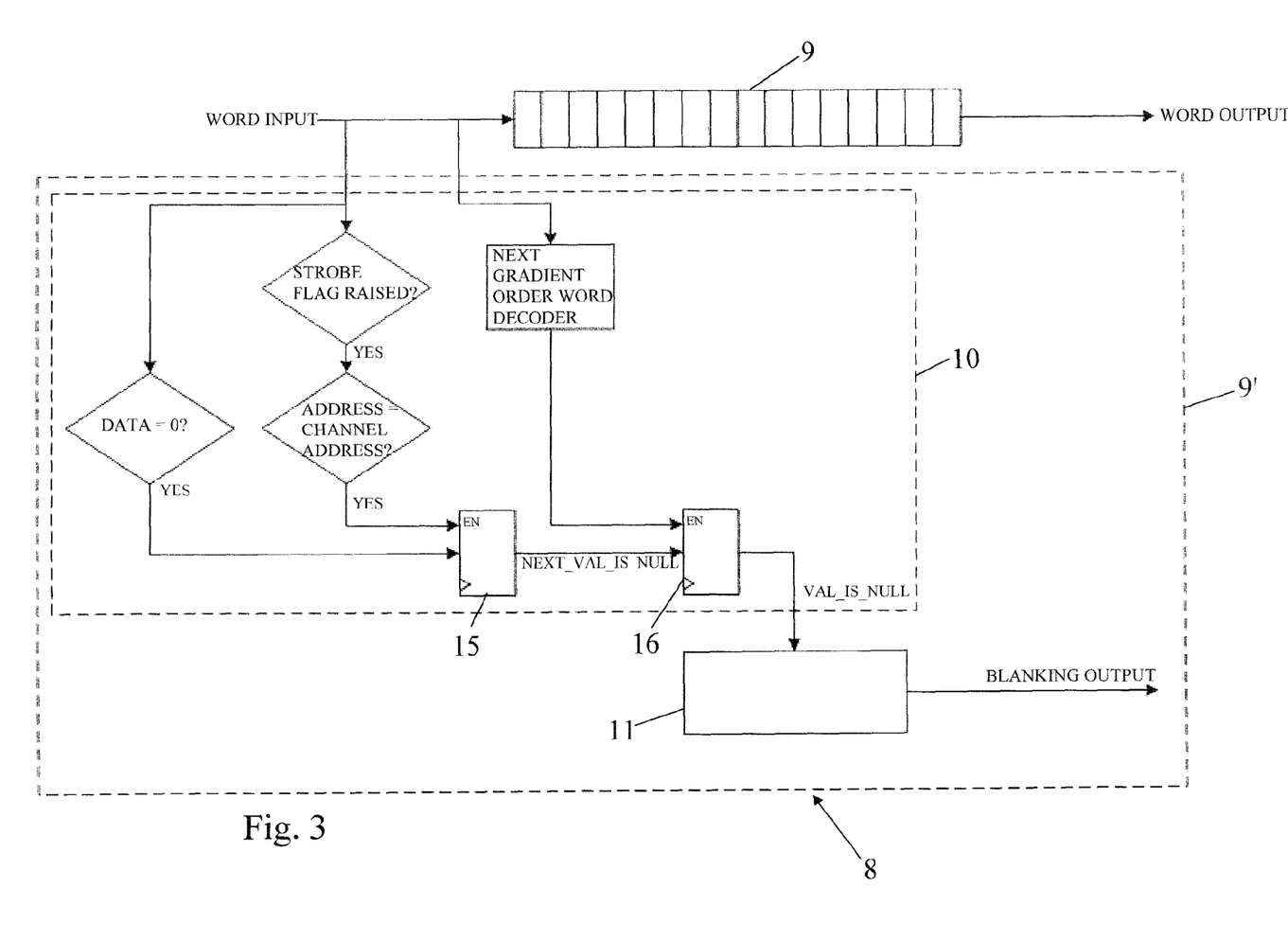
FIG. 3 is a partial block diagram of an embodiment of an automatic blanking generator according to the invention, being part of the system represented on FIG. 1.

Nevertheless, as shown on FIG. 3, the automatic blanking system 8 advantageously consists entirely or almost entirely of a hardware system running in accordance with a reference clock.

Said system 8 comprises then, on the one hand, a (hardware) gradient data word/stream delaying means 9, such as a shift register or a FIFO stack, and, on the other hand, for each gradient channel, i) hardware sensing and evaluating means 10 which are adapted to sense the values of specific or predetermined fields of the successive gradient data words intended for a considered gradient channel and to determine whether the next data word forwarded to the concerned [converter/amplifier] module 6 will result in no current being supplied to the associated gradient coil (2) and ii) hardware delaying and conditional delivering means 11 for the blanking signal, whose active/inactive state is determined by the successive values provided by the aforementioned sensing and evaluating means 10.

In order to take into account certain constraints of the modules 6, the sensing and evaluating means 10 sense the gradient data word stream at the input of the delaying means 9 and the time lag induced by said delaying means 9 is set in relation to the activation time lag $T_1$ of the power stage of the amplifier 5 of the [converter/amplifier] module 6 of the considered gradient channel.

Similarly, the time lag induced, for each gradient channel, by the blanking signal delivering means 11 of the automatic blanking system 8, between the sensing of the first gradient data word corresponding to no current being fed to the considered gradient coil 2 and the switching of the blanking signal, is set in relation to the sum of the activation time lag $T_1$ of the power stage of the amplifier 5 of the considered [converter/amplifier] module 6 and of a disabling time lag $T_2$ of said gradient channel, depending on the amplifier 5 frequency response and the electrical characteristics of the considered gradient coil 2.

Figure 4:
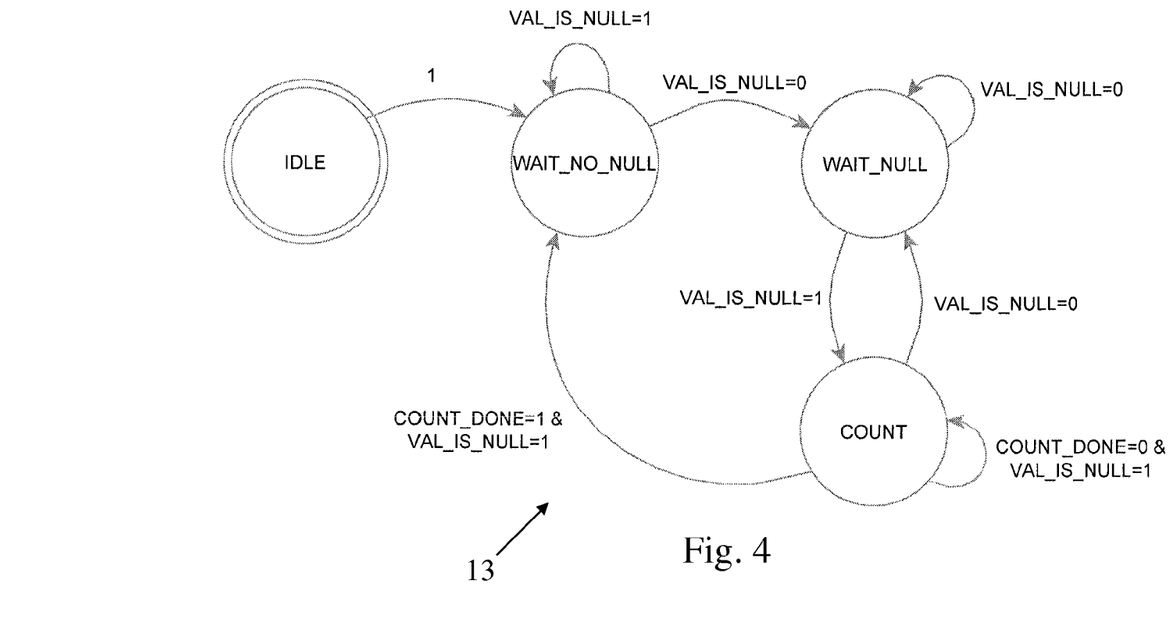
FIG. 4 is a functional diagram of a finite state machine forming one part of the blanking delay generator of the automatic blanking system of FIG. 3, and, FIG. 5 is a functional diagram of a counter forming the other part of the blanking delay generator of the automatic blanking system of FIG. 3.
Figure 5:
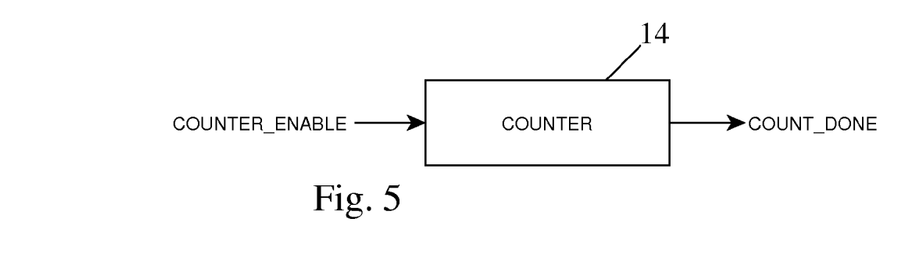

According to an other feature of the invention, and as illustrated on FIGS. 4 and 5, the blanking signal delivering means 11 for each gradient channel is implemented as a functional assembly of a finite state machine 13 and a counter 14, the latter being driven by said machine 13 and both machine 13 and counter 14 being synchronised with the word stream clock at the input of the gradient data word stream delaying means 9.

In the following, one possible embodiment of the automatic blanking system 8 will be described more precisely in connection with FIGS. 3 to 5 of the drawings, as a non limitative example in case of three gradient channels X, Y and Z.

As shown on FIG. 3, the system 8 is composed of a unique word delaying means 9 (for example a shift register) and of three conditional blanking generators 9', one for each gradient channel (one only being shown on FIG. 3, the others having a similar structure).

The shift register 9 is used as a delay line and so allows to delay the word output stream against the word input stream by a constant number of reference clock cycles. This number is determined by the number of stages which are composing the register.

The stage count of the shift register 9 is computed as follows:

$T_1$ is defined as on FIG. 1,
$T_1$ is proportional to the synchronizing clock period T: $T_1 = n_1 T$.
The stage count is then: $n_1 + 2$ By inserting the shift register 9 into the word stream, the word sequence is not modified, the stream being only delayed.

Each conditional blanking generator 9' senses the word stream at the input of the shift register 9 and then generates a blanking signal with respect to the data words contents intended for the specific gradient channel.

Sub-part 10 corresponding to aforementioned sensing and evaluating means acts as a data value detector which generates a flag. This flag depends on the last data value stored in the shift register 9 for a given gradient channel. If the data value is null the VAL_IS_NULL flag is raised. Else the flag is down.

Latch 15 which is synchronized with the input word clock of shift register 9 stores the input word data zero detection result. Latch 15 is enabled when a data word intended for the specific channel is loaded into the shift register. In others terms, latch 15 is enabled when the strobe flag of the input word is raised and the address equals the specific gradient channel address.

Consequently the output signal of latch 15 is a flag (NEXT_VAL_IS_NULL, see FIG. 3) which is raised when the last data word stored in the shift register 9 intended for the specific gradient channel equals zero.

When latch 16 (also synchronized with the input word clock) is enabled the state of the NEXT_VAL_IS_NULL is propagated to the VAL_IS_NULL state. Latch 16 is enabled when a next gradient order word is stored into the shift register 9.

Consequently the VAL_IS_NULL flag is synchronized with the reception of the Next Gradient Order which signals that the last latched data for each gradient will be taken into account and sent to the converter 4 at the shift register 9 output.

Sub-part 11 corresponds to the aforementioned selective delivering and delaying means, and acts as a blanking delay generator. This part is implemented as a finite state machine 13 (see FIG. 4) and a counter 14 (see FIG. 5). These two parts are also synchronized with the input word clock of the shift register 9.

The transitions of the state machine 13 are determined by the state of two flags:

VAL_IS_NULL: this flag is set when the last gradient data value for the specific gradient channel (see previous description) equals zero.

COUNT_DONE: this flag is set when the delay counter 14 of the conditional blanking generator 9' reaches a specified value.

The state machine 13 works as follows:

At startup the IDLE state is active. After the first clock cycle the WAIT_NO_NULL state is active.

The WAIT_NO_NULL state stays active (and so blanking is enabled—see table 1) as long as the last gradient data for the specific channel equals zero (i.e. VAL_IS_NULL=1). When the last gradient data for the specific channel becomes different from zero, the WAIT_NULL state becomes active.

The WAIT_NULL state stays active (and so blanking is disabled—see table 1) as long as the last gradient data for the specific channel is different from zero (i.e. VAL_

IS_NULL=0). When the last gradient data for the specific channel equals zero, the COUNT state becomes active.

The COUNT state stays active (and so blanking is disabled, and the counter is enabled—see table 1) as long as counter 14 has not reached its counting limit. If the last gradient data for the specific channel becomes different from zero (i.e. VAL_IS_NULL=0) during the count, then the WAIT_NULL state becomes active. When the counter has reached the counting limit (COUNT_DONE=1), the WAIT_NO_NULL state becomes active.

Counter 14 is used to delay the blanking signal when the blanking signal has to be enabled.

The counter is enabled with the COUNTER_ENABLE signal which is driven by the state machine 13. When the counter 14 is disabled its count value is reset. When the counter value reaches its counting limit the COUNT_DONE flag is raised.

The counting limit is defined as follows:

$T_1$ and $T_2$ are defined on FIG. 1.

$T_1$ and $T_2$ are proportional to the synchronizing clock period T: $T_1=n_1 T$ and $T_2=n_2 T$.

The counting limit is then defined by: $Lim=n1+n2-1$.

Table 1 hereunder summarizes the outputs of the state machine 13, as described before.

TABLE 1

| State | Output values |
|---|---|
| IDLE | BLANKING = 1 |
| | COUNTER_ENABLE = 0 |
| WAIT_NO_NULL | BLANKING = 1 |
| | COUNTER_ENABLE = 0 |
| WAIT_NULL | BLANKING = 0 |
| | COUNTER_ENABLE = 0 |
| COUNT | BLANKING = 0 |
| | COUNTER_ENABLE = 1 |

The present invention also concerns a NMR or MRI system comprising at least one magnetic field gradient generating system, characterised in that said at least one gradient generating system consists in a system 1 as described herein before.

Furthermore, the present invention encompasses also a method for reducing the noise level in NMR/MRI experiments, in particular during acquisition phases in a NMR or MRI system comprising at least one magnetic field gradient generating system.

Such a gradient generating system 1 is generally, as shown on FIG. 2 for example, mainly composed of at least one set of gradient coils 2, preferably arranged according to the three axes X, Y, Z of a spatial referential system, and of controlled power supplying means 3 for said gradient coils. Said power supplying means 3 comprise, for each gradient coil, a [converter 4/amplifier 5] module 6, said modules 6 being fed with pulse sequences of digital gradient data provided as word streams by an adapted generator 7 according to a pulse program, each arrangement of a gradient coil and a converter/amplifier module forming a gradient channel.

Said method is characterised in that it mainly consists in using an automatic blanking system 8 forming part of the controlled power supplying means 3, in order to sense the digital gradient data sent to the [converter 4/amplifier 5] modules 6 and, according to the sensed values, to generate selectively blanking signals which are applied to said modules 6 for disabling the power stages of their respective amplifiers 5 connected to the respectively associated gradient coils 2, when no current is to be fed to said coils 2.

More specifically said method may consist, by means of the automatic blanking system 8, in performing the following steps:

delaying the transmission of the successive gradient data words or word stream to the [converter/amplifier] modules 6:

sensing and evaluating the values of the aforementioned data words;

selectively delivering, in a time controlled manner or with a delay, blanking signals, according to the evaluation results of the sensed values;

applying the concerned blanking signal to the amplifier 5 of the [converter/amplifier] module 6 of the corresponding gradient channel, synchronised with the corresponding null gradient data and by taking into account the response time lags $T_1$, $T_2$ of the amplifiers 5 of said channels.

According to the invention, the blanking system used in order to perform the noise reducing method consists in an automatic blanking system 8 as described herein before.

The present invention is, of course, not limited to the preferred embodiments described and represented herein, changes can be made or equivalents used without departing from the scope of the invention.

The invention claimed is:

1. Magnetic field gradient generating system for a NMR/MRI system, comprising at least one set of gradient coils, preferably arranged according to the three axes X, Y, Z of a spatial referential system, and controlled power supplying means for said gradient coils, said power supplying means comprising, for each gradient coil, a converter/amplifier module, said modules being fed with pulse sequences of digital gradient data provided as word streams by an adapted gradient data generator according to a pulse program, each arrangement of a gradient coil and a converter/amplifier module forming a gradient channel, gradient generating system (1) characterised in that said controlled power supplying means (3) also comprise an automatic blanking system (8) which scans the gradient data words sent to the [converter (4)/amplifier (5)] modules (6) and, according to the sensed values, selectively generates blanking signals to be applied to said modules (6) in order to disable the power stages of their respective amplifiers (5) connected to the gradient coils (2), when no current is to be fed to said coils (2).

2. Magnetic field gradient generating system according to claim 1, characterised in that the automatic blanking system (8) is mainly comprised of means (9) for delaying the transmission of the successive gradient data words to the [converter/amplifier] modules (6), means (10) for sensing and evaluating the values of the delayed data words and means (11) for selectively delivering, in a time controlled manner and/or with a delay, a blanking signal to be applied to the amplifier (5) of the [converter/amplifier] module (6) of the corresponding gradient channel, according to the evaluation results of the successively sensed values.

3. Magnetic field gradient generating system according to claim 2, characterised in that the sensing and evaluating means (10) sense the gradient data word stream at the input of the delaying means (9) and in that the time lag induced by said delaying means (9) is set in relation to the activation time lag ($T_1$) of the power stage of the amplifier (5) of the [converter/amplifier] module (6) of the considered gradient channel.

4. Magnetic field gradient generating system according to claim 2, characterised in that the time lag induced, for each gradient channel, by the blanking signal delivering means (11) of the automatic blanking system (8), between the sensing of the first gradient data word corresponding to no current being fed to the considered gradient coil (2) and the generating of the blanking signal, is set in relation to the sum of the activation time lag ($T_1$) of the power stage of the amplifier (5) of the considered [converter/amplifier] module (6) and of a disabling time lag ($T_2$) of said gradient channel, depending on the amplifier (5) frequency response and the electrical characteristics of the considered gradient coil (2).

5. Magnetic field gradient generating system according to claim 2, characterised in that the blanking signal delivering means (11) for each gradient channel is implemented as a functional assembly of a finite state machine (13) and a counter (14), the latter being driven by said machine (13) and both machine (13) and counter (14) being synchronised with the word stream clock at the input of the gradient data word stream delaying means (9).

6. NMR or MRI system comprising at least one magnetic field gradient generating system, characterised in that said at least one gradient generating system consists in a system (1) according to claim 1.

7. Magnetic field gradient generating system according to claim 2, characterised in that the single stream of digital gradient data words, which is provided by the gradient data generator (7) according to a single pulse program and sensed by the automatic blanking system (8), incorporates gradient control data for each gradient coil (2) and in that a data dispatcher module (12) is provided which extracts the data words for each gradient coil (2) and delivers it to the corresponding associated [converter/amplifier] module (6), the automatic blanking system (8) generating selectively a specific blanking signal to the amplifier (5) of each module (6), according to the sensed values of the successive data words intended for the considered gradient coil (2).

8. Magnetic field gradient generating system according to claim 2, characterised in that the automatic blanking system (8) consists of a hardware system synchronised with a reference clock and in that it comprises, on the one hand, a gradient data word/stream delaying means (9), such as a shift register or a FIFO stack, and, on the other hand, for each gradient channel, i) sensing and evaluating means (10) which are adapted to sense the values of specific fields of the successive gradient data words intended for a considered gradient channel and to determine whether the next data word forwarded to the concerned [converter/amplifier] module (6) will result in no current being supplied to the associated gradient coil (2) and ii) delaying and conditional delivering means (11) for the blanking signal, whose active/inactive state is determined by the successive values provided by the aforementioned sensing and evaluating means (10).

9. Magnetic field gradient generating system according to claim 1, characterised in that the single stream of digital gradient data words, which is provided by the gradient data generator (7) according to a single pulse program and sensed by the automatic blanking system (8), incorporates gradient control data for each gradient coil (2) and in that a data dispatcher module (12) is provided which extracts the data words for each gradient coil (2) and delivers it to the corresponding associated [converter/amplifier] module (6), the automatic blanking system (8) generating selectively a specific blanking signal to the amplifier (5) of each module (6), according to the sensed values of the successive data words intended for the considered gradient coil (2).

10. Magnetic field gradient generating system according to claim 1, characterised in that the automatic blanking system (8) consists of a hardware system synchronised with a reference clock and in that it comprises, on the one hand, a gradient data word/stream delaying means (9), such as a shift register or a FIFO stack, and, on the other hand, for each gradient channel, i) sensing and evaluating means (10) which are adapted to sense the values of specific fields of the successive gradient data words intended for a considered gradient channel and to determine whether the next data word forwarded to the concerned [converter/amplifier] module (6) will result in no current being supplied to the associated gradient coil (2) and ii) delaying and conditional delivering means (11) for the blanking signal, whose active/inactive state is determined by the successive values provided by the aforementioned sensing and evaluating means (10).

11. Magnetic field gradient generating system according to claim 10, characterised in that the sensing and evaluating means (10) sense the gradient data word stream at the input of the delaying means (9) and in that the time lag induced by said delaying means (9) is set in relation to the activation time lag ($T_1$) of the power stage of the amplifier (5) of the [converter/amplifier] module (6) of the considered gradient channel.

12. Magnetic field gradient generating system according to claim 10, characterised in that the time lag induced, for each gradient channel, by the blanking signal delivering means (11) of the automatic blanking system (8), between the sensing of the first gradient data word corresponding to no current being fed to the considered gradient coil (2) and the generating of the blanking signal, is set in relation to the sum of the activation time lag ($T_1$) of the power stage of the amplifier (5) of the considered [converter/amplifier] module (6) and of a disabling time lag ($T_2$) of said gradient channel, depending on the amplifier (5) frequency response and the electrical characteristics of the considered gradient coil (2).

13. Magnetic field gradient generating system according to claim 10, characterised in that the blanking signal delivering means (11) for each gradient channel is implemented as a functional assembly of a finite state machine (13) and a counter (14), the latter being driven by said machine (13) and both machine (13) and counter (14) being synchronised with the word stream clock at the input of the gradient data word stream delaying means (9).

14. Method for reducing the noise level in NMR/MRI experiments, in particular during acquisition phases in a NMR or MRI system comprising at least one magnetic field gradient generating system which is mainly composed of at least one set of gradient coils, preferably arranged according to the three axes X, Y, Z of a spatial referential system, and of controlled power supplying means for said gradient coils, said power supplying means comprising, for each gradient coil, a converter/amplifier module, said modules being fed with pulse sequences of digital gradient data provided as word streams by an adapted generator according to a pulse program, each arrangement of a gradient coil and a converter/amplifier module forming a gradient channel, method characterised in that it mainly consists in using an automatic blanking system (8) forming part of the controlled power supplying means (3), in order to scan the digital gradient data sent to the [converter (4)/amplifier (5)] modules (6) and, accordingly to the sensed values, to generate selectively blanking signals which are applied to said modules (6) for disabling the power stages of their respective amplifiers (5) connected to the respectively associated gradient coils (2), when no current is to be fed to said coils (2).

15. Method according to claim 14, characterised in that it consists, by means of the automatic blanking system (8), in performing the following steps:

delaying the transmission of the successive gradient data words or word stream to the [converter/amplifier] modules (6);

sensing and evaluating the values of the above mentioned data words;

selectively delivering, in a time controlled manner or with a delay, blanking signals, according to the evaluation results of the sensed values;

applying the concerned blanking signal to the amplifier (5) of the [converter/amplifier] module (6) of the corresponding gradient channel, synchronised with the corresponding null gradient data and by taking into account the response time lags ($T_1$, $T_2$) of the amplifiers (5) of said channels.

16. Method according to claim 14, characterised in that the blanking system (8) is mainly comprised of means (9) for delaying the transmission of the successive gradient data words to the [converter/amplifier] modules (6), means (10) for sensing and evaluating the values of the delayed data words and means (11) for selectively delivering, in a time controlled manner and/or with a delay, a blanking signal to be applied to the amplifier (5) of the [converter/amplifier] module (6) of the corresponding gradient channel, according to the evaluation results of the successively sensed values.

17. Method according to claim 15, characterised in that the blanking system (8) is mainly comprised of means (9) for delaying the transmission of the successive gradient data words to the [converter/amplifier] modules (6), means (10) for sensing and evaluating the values of the delayed data words and means (11) for selectively delivering, in a time controlled manner and/or with a delay, a blanking signal to be applied to the amplifier (5) of the [converter/amplifier] module (6) of the corresponding gradient channel, according to the evaluation results of the successively sensed values.

* * * * *